United States Patent [19]
Snelgrove

[11] Patent Number: 5,657,017
[45] Date of Patent: Aug. 12, 1997

[54] TELEMETRY BI-PHASE-LEVEL TO NON-RETURN-TO-ZERO-LEVEL SIGNAL CONVERTER

[75] Inventor: Andrew H. Snelgrove, Ventura, Calif.

[73] Assignee: The United States of America as represented by the Secretary of the Navy, Washington, D.C.

[21] Appl. No.: 591,179

[22] Filed: Dec. 1, 1995

[51] Int. Cl.⁶ ........................................ H03M 5/12
[52] U.S. Cl. ................................ 341/70; 341/68
[58] Field of Search ........................... 341/68–70

[56] References Cited

U.S. PATENT DOCUMENTS

| | | | |
|---|---|---|---|
| 4,313,103 | 1/1982 | Shull | 341/70 |
| 4,603,322 | 7/1986 | Blair | 340/347 |
| 5,446,765 | 8/1995 | Leger | 375/359 |
| 5,550,864 | 8/1996 | Toy et al. | 375/293 |
| 5,602,873 | 2/1997 | Balasubramanian et al. | 375/242 |

Primary Examiner—Jeffrey A. Gaffin
Assistant Examiner—Jason H. Vick
Attorney, Agent, or Firm—Melvin J. Sliwka; David S. Kalmbaugh

[57] ABSTRACT

A signal converter for converting a bi-phase-level data stream to non-return-to-zero-level data. The bi-phase-level data stream is input to a detector circuit. When the detector circuit detects a high level for more than half of a bit period, the detector circuit provides a logic zero pulse at a state S7. If the high level is not at the logic one state for a sufficient time period the detector circuit will not reach state s7. If the time period is to short than the detector circuit is reset to state s0. This high level pulse occurs whenever the second half of a bit period is high followed by a high in the first half of the following bit period. A sample is taken on the first half of every bit period. A low at the detector circuit keeps the detector circuit at state s0. A clock signal generating circuit receives the logic zero pulse and then proceeds through its states s0–s10. When state S1 is reached a clock pulse is provided by the clock signal generating circuit. This clock pulse is supplied to a Flip-Flop which also receives the bi-phase-level data stream. The clock pulse then clocks the logic level of the bi-phase-level data stream through the Flip-Flop to its output thereby providing a non-return-to-zero-level coded waveform or data stream.

13 Claims, 3 Drawing Sheets

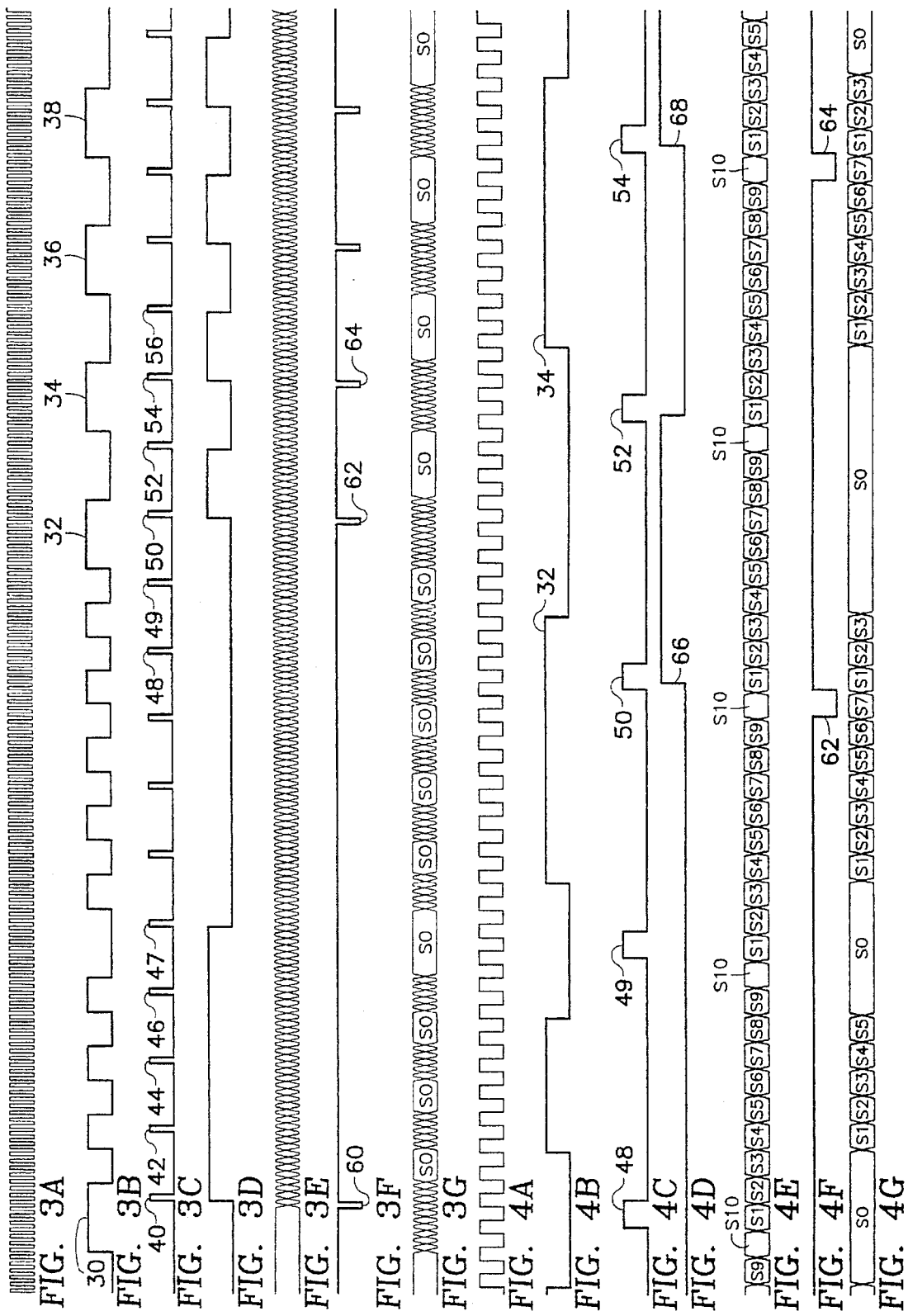

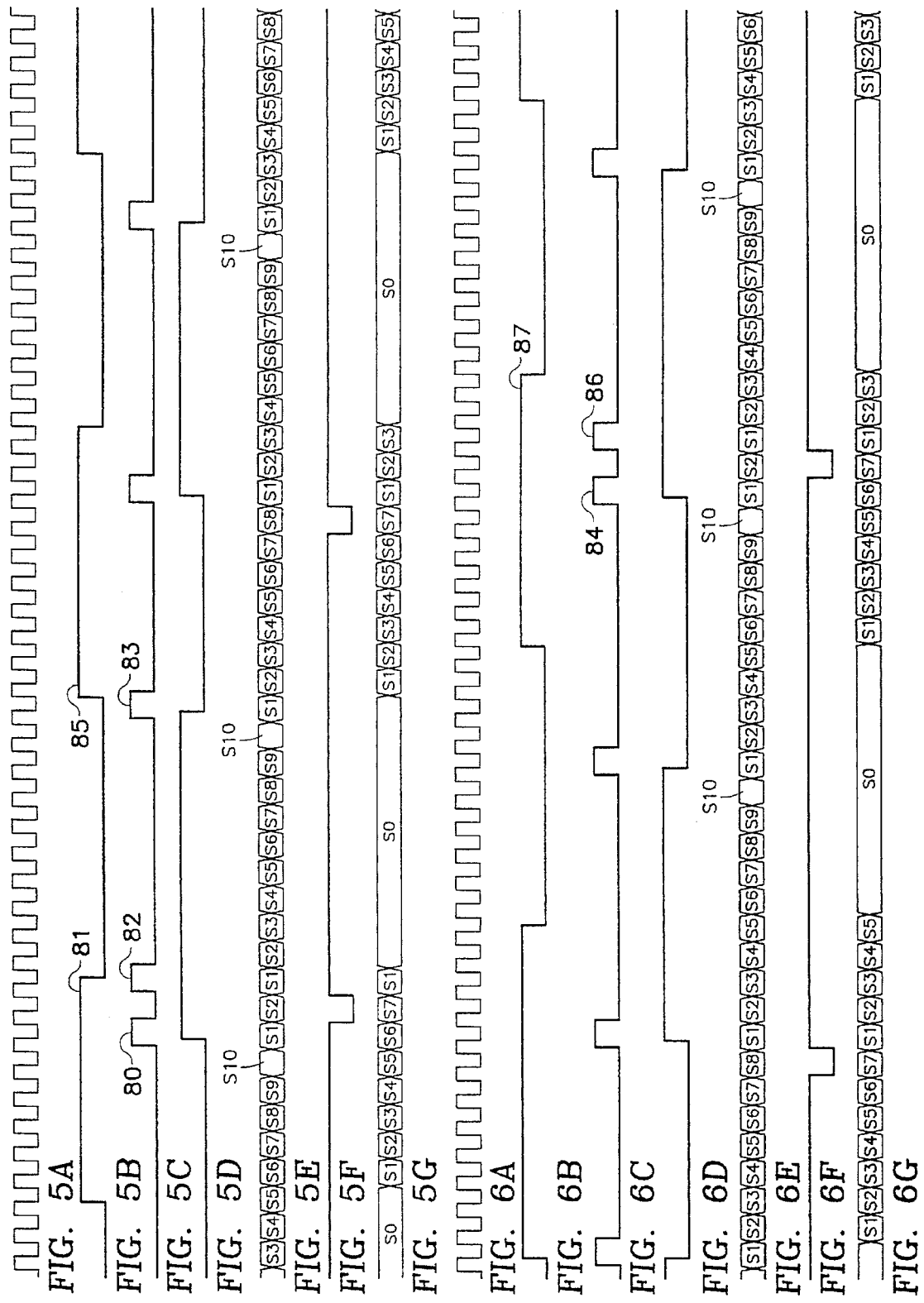

TELEMETRY BI-PHASE-LEVEL TO NON-RETURN-TO-ZERO-LEVEL SIGNAL CONVERTER

BACKGROUND OF THE INVENTION

1. Field of the Invention

The present invention relates generally to telemetry data transmission from a missile to a receiving station. More specifically, the present invention relates to a signal converting circuit for converting a missile's telemetry data which is bi-phase-level data to non-return-to-zero-level data for processing by a receiving station.

2. Description of the Prior Art

A missile's telemetry unit transmits data, including guidance, tracking and other information, in a coded waveform format to a receiving station. The receiving station then processes the information to determine the performance of the missile during flight.

One coded waveform for transmitting information from a missile in flight to a receiving station is identified as Bi-Phase-level coded waveform or Split Phase coded waveform. When the missile's data arrives at the receiving station there is generally a need to convert the data to a second coded waveform format to allow the receiving station to process the data. The coded waveform used at a receiving station to process a missile's flight data is identified as the Non-Return-To-Zero-Level coded waveform.

Accordingly there is a need to provide a signal converter to convert a missile's telemetry data from bi-phase-level data to non-return-to-zero-level data to allow the receiving station to process the data. There is also a need to provide a signal converter which can extract from the missile's bi-phase-level telemetry data a non-return-to-zero-level clock signal.

SUMMARY OF THE INVENTION

The present invention provides a signal converter which fulfills the need for a simplified electronics circuit which converts a bi-phase-level data stream from a missile's telemetry system to non-return-to-zero-level data for processing by a receiving station. The bi-phase-level data stream is input to the asynchronous clear input of a high level detector circuit. When the high level detector circuit detects a high level for more than half of a bit period, the high level detector circuit provides a logic zero pulse at a state S7. If the high level is not at the logic one state for a sufficient time period the high level detector circuit will not reach state s7. If the time period is too short, then the high level detector circuit is reset to state s0.

This high level logic zero pulse occurs whenever the second half of a bit period is high followed by a high in the first half of the following bit period. A sample is taken on the first half of every bit period. A low at the asynchronous input of the high level detector circuit keeps the high level detector circuit at state s0.

An NRZL clock signal generating circuit receives the logic zero pulse and then proceeds through its states s0–s10. When state S1 is reached a clock pulse is provided at the output of the NRZL clock signal generating circuit.

This clock pulse is supplied to a Flip-Flop which also receives the bi-phase-level data stream. The clock pulse then clocks the logic level of the bi-phase-level data stream through the Flip-Flop to its output thereby providing a non-return-to-zero-level coded waveform or data stream.

BRIEF DESCRIPTION OF THE DRAWINGS

FIGS. 3A–3G illustrate an example of the waveforms occurring at the inputs and outputs of the converter of FIG. 1 during the conversion of bi-phase-level data to non-return-to-zero-level data by the converter of FIG. 1;

FIGS. 4A–4G illustrate an enlarged portion of the waveforms of FIGS. 3A–3G;

FIGS. 5A–5G illustrate another example of the waveforms occurring at the inputs and outputs of the converter of FIG. 1 during the conversion of bi-phase-level data to non-return-to-zero-level data by the converter of FIG. 1; and FIGS. 6A–6G illustrate a third example of the waveforms occurring at the inputs and outputs of the converter of FIG. 1 during the conversion of bi-phase-level data to non-return-to-zero-level data by the converter of FIG. 1.

DETAILED DESCRIPTION OF THE PREFERRED EMBODIMENT

Figure 1:
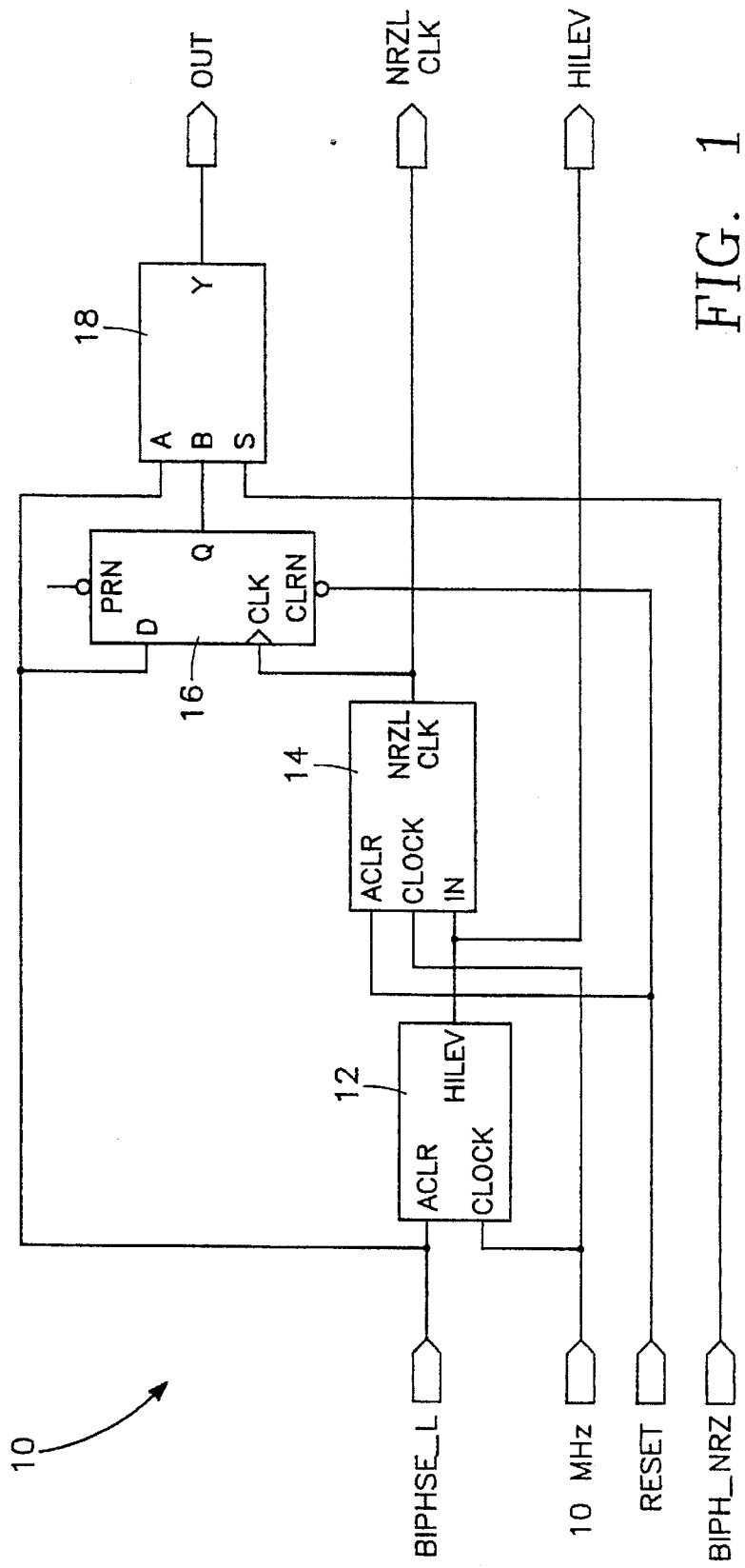
FIG. 1 is a detailed electronics circuit diagram of the telemetry bi-phase-level to non-return-to-zero-level signal converter constituting the present invention.

Referring to FIG. 1 there is shown an electronic diagram of the telemetry bi-phase-level to non-return-to-zero-level signal converter 10 constituting the present invention. Signal converter 10 receives a missile's telemetry data which is bi-phase-level (Biφ-L) data and then converts to non-return-to-zero-level (NRZ-L) data for processing by a receiving station.

Figure 2:
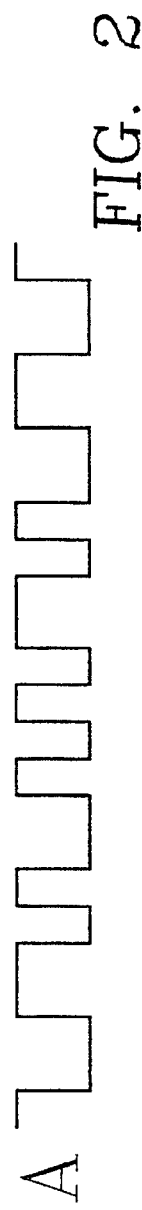
FIG. 2 illustrates a waveform for a telemetry bi-phase-level data stream.

Bi-phase-level data is data which has a level change occur at the center of every bit. A logic "one" is represented by a one level with a transition to the zero level. A logic "zero" is represented by a zero level with a transition to the one level. FIG. 2A represents a bi-phase-level data stream provided to a receiving station by a missile's telemetry unit which has the following bit pattern "1,0,1,1,0,0,0,1,1,0,1,0". Non-return-to-zero-level data is wherein a logic "one" is represented by a one level and a logic "zero" is represented by a zero level.

Referring to FIGS. 1, 3A–3G and 4A–4G, signal converter 10 receives an externally generated ten megahertz clock signal (FIG. 3A) at its 10 MHz input and a bi-phase-level data stream (FIG. 3B) from a missile's telemetry unit at its BIPHSE_L input. The ten megahertz clock signal of FIG. 3A is next supplied to the CLOCK input of a high level decoder circuit 12, while the bi-phase-level data stream of FIG. 3B is supplied to the ACLR input (asynchronous clear input) of circuit 12. High level decoder circuit 12 is a state machine which is implemented by the program set forth in Appendix A.

The program language used to generate the program of Appendix A is "ALTERA MAX+PLUSII" commercially available from the Altera Corporation of San Jose, Calif. and is adapted for use with any of the Erasable Programmable Logic Device commercially available from Altera Corporation such as Altera's Model EPM5128-2 Erasable Programmable Logic Device The ten megahertz clock signal of FIG. 3A causes high level decoder circuit 12 to be clocked from state s0 thru states s1, s2, s3, s4, s5, s6 to state s7 and then return to state s1 whenever the ACLR input to high level decoder circuit 12 is at the logic one state. When high level detector circuit 12 transitions from state s6 to state s7, the HILEV output of high level decoder circuit 12 transitions from the logic one state to the logic zero state. The transition of high level detector circuit 12 from state s7 to state s1 causes the HILEV output of circuit 12 to next transition from the logic zero state to the logic one state.

For example, after the bi-phase-level data stream of FIG. 3B first transitions to a logic one (designated by the reference numeral 30) the bi-phase-level data stream of FIG. 3B will remain at the logic one state for a time period which is sufficient to allow high level detector circuit 12 to transition from state s6 to state s7 and then to state s1 so as to allow circuit 12 to generate at its HILEV output the negative going pulse 60 (FIG. 3F). When the bi-phase-level data stream of FIG. 3B again transitions to the logic one state (reference numeral 32) for a time period which is sufficient to allow high level detector circuit 12 to transition from state s6 to state s7 and then to state s1, circuit 12 will provide at its HILEV output a negative going pulse 62 (FIG. 3F). When the bi-phase-level data stream of FIG. 3B next transitions to the logic one state (reference numeral 34) for a time period which is sufficient to allow high level detector circuit 12 to transition from state s6 to state s7 and then to state s1, circuit 12 will provide at its HILEV output a negative going pulse 64 (FIG. 3F).

At this time it should be noted that high level detector circuit 12 provide a negative going pulse whenever the bi-phase-level data stream of FIG. 3B includes a zero bit which is followed by a one bit so as to provide a time period which is sufficient to allow circuit 12 to transition from state s6 to state s7 and then to state s1. The generation of negative going pulses occurs at reference numerals 30, 32, 34, 36 and 38 as is best by the waveform of FIG. 3F.

Flip-Flop 16 has a CLRN input for receiving an externally generated reset signal which clears Flip-Flop 16 so that the Q output of Flip-Flop 16 is reset to the logic zero state. The negative going pulses of FIG. 3F including pulses 60, 62 and 64 are supplied to the IN input of an NRZL clock signal generating circuit 14 and the HILEV output of telemetry bi-phase-level to non-return-to-zero-level signal converter 10.

The program listing used to implement NRZL clock signal generating circuit 14 is set forth in Appendix B. The program language used to generate the program of Appendix B is "ALTERA MAX+PLUSII" and is also adapted for use with any of the Erasable Programmable Logic Device commercially available from Altera Corporation such as Altera's Model EPM5128-2 Erasable Programmable Logic Device.

As is best illustrated in Appendix B, NRZL clock signal generating circuit 14 is a state machine which is clocked through ten states s0, s1 s2, s3, s4, s5, s6, s7, s8, s9 and s10 by the ten megahertz clock signal of FIG. 3A in the manner set forth in Appendix B.

Referring to lines 21–26 of Appendix B, when NRZL clock signal generating circuit 14 is at state s0 and a logic one is provided to the IN input of circuit 14, NRZL clock signal generating circuit 14 will remain at state s0. If a logic zero is supplied to the IN input of circuit 14, the ten megahertz clock signal of FIG. 3A will clock circuit 14 from state s0 to state s1.

Referring to lines 27–32 of Appendix B, when NRZL clock signal generating circuit 14 is at state s1 and a logic zero is provided to the IN input of circuit 14, NRZL clock signal generating circuit 14 will remain at state s1. If a logic one is supplied to the IN input of circuit 14, the ten megahertz clock signal of FIG. 3A will clock circuit 14 from state s1 to state s2.

Referring to lines 33–38 of Appendix B, when NRZL clock signal generating circuit 14 is at state s2 and a logic zero is provided to the IN input of circuit 14, NRZL clock signal generating circuit 14 will return to state s1. If a logic one is supplied to the IN input of circuit 14, the ten megahertz clock signal of FIG. 3A will clock circuit 14 from state s2 to state s3.

Referring to lines 38–44 of Appendix B, the ten megahertz clock signal of FIG. 3A will next clock circuit 14 from state s3 through states s4, s5, s6 and s7 to state s8.

Referring to lines 44–49 of Appendix B, when circuit 14 is at state s8 and a logic zero is supplied to the IN input of circuit 14, the ten megahertz clock signal of FIG. 3A will clock circuit 14 from state s8 to state s1. If a logic one is supplied to the IN input of circuit 14, the ten megahertz clock signal of FIG. 3A will clock circuit 14 from state s8 to state s9.

Referring to lines 50–55 of Appendix B, when circuit 14 is at state s9 and a logic zero is supplied to the IN input of circuit 14, the ten megahertz clock signal of FIG. 3A will clock circuit 14 from state s9 to state s1. If a logic one is supplied to the IN input of circuit 14, the ten megahertz clock signal of FIG. 3A will clock circuit 14 from state s9 to state s10.

Referring to lines 56–58 of Appendix B, when circuit 14 is at state s10, the ten megahertz clock signal of FIG. 3A will clock circuit 14 from state s10 to state s1.

Referring to FIGS. 1 and 4A–4G, whenever, NRZL clock signal generating circuit 14 is at state s1 the NRZLCLK output of circuit will provide a logic one pulse (line 60 of Appendix A). As is best illustrated by FIGS. 4C and 4E, when NRZL clock signal generating circuit 14 is at state s1 (FIG. 4E), clock pulses 48, 49, 50, 52 and 54 (FIG. 4C) are provided at the output of circuit 14 and then supplied to the NRZLCLK output of signal converter 10. As shown in FIG. 4C, signal converter 10 provides at its NRZLCLK output the NRZL clock signal of FIG. 4C which includes clock pulses 40, 42, 44, 46 and 47 as well as clock pulses 48, 49, 50, 52, 54 and 56.

The NRZL clock signal of FIG. 3C is supplied to the CLK input of D-type Flip-Flop 16 clocking the bi-phase-level data stream of FIG. 3B through Flip-Flop 16 to its Q output and then to the B input of a multiplexer 18. For example, clock pulses 40, 42, 44, 46, 50 and 54 (FIG. 3C) each clock a logic one of the data stream of FIG. 3B through Flip-Flop 16 to its Q output. In a like manner, clock pulses 47, 48, 49, 52 and 56 (FIG. 3C) each clock a logic zero of the data stream of FIG. 3B through Flip-Flop 16 to its Q output.

When a logic zero is provided through the BIPH_NRZ input of signal converter 10 to the S (select) input of multiplexer 18 the data supplied to the B input of multiplexer 18 will pass through multiplexer 18 to its Y output and then to the OUT output of signal converter 10. This, in turn, is the non-return-to-zero-level data stream of FIG. 3D and FIG. 4D. Similarly, when a logic one is provided to the S input of multiplexer 18 the data stream of FIG. 3B, which is supplied to the A input of multiplexer 18, will pass through multiplexer 18 to the OUT output of signal converter 10.

Referring to FIGS. 1 and 5A–5G, when high level decoder circuit 12 is first clocked to state s7 (FIG. 5G) and the data stream of FIG. 5B is at the logic one state (reference numeral 81), a negative going pulse (FIG. 5F) is provide at the HILEV output of circuit 12. This negative going pulse is supplied to the IN input of NRZL clock signal generating circuit 14. Since NRZL clock signal generating circuit 14 is at state s2 (FIG. 5E), the next clock pulse of the ten megahertz clock signal of FIG. 5A will result in circuit 14 being clocked from state s2 to state s1 (FIG. 5E). At state S1 NRZL clock signal generating circuit 14 generates the NRZL clock pulse 82 (FIG. 5C).

The NRZL clock pulse 80 was previously generated by NRZL clock signal generating circuit 14 when circuit 14 transition from state S10 to state S1 (FIG. 5E) and the data stream of FIG. 5B was at a logic one (reference numeral 81). Each clock pulse 80 and 82 was generated by circuit 14 during the second half of the time period the data stream of FIG. 5B is first at the logic one state (reference numeral 81).

Referring to FIGS. 1 and 6A–6G, when high level decoder circuit 12 is clocked to state s7 (FIG. 6G) and the data stream of FIG. 6A is at the logic one state (reference numeral 87, a negative going pulse (FIG. 6F) is provide at the HILEV output of circuit 12. This negative going pulse is supplied to the IN input of NRZL clock signal generating circuit 14. Since NRZL clock signal generating circuit 14 is at state s2 (FIG. 6E), the next clock pulse of the ten megahertz clock signal of FIG. 6A will result in circuit 14 being clocked from state s2 to state s1 (FIG. 6E). At state S1 NRZL clock signal generating circuit 14 generates the NRZL clock pulse 86 (FIG. 6C). When circuit 14 previously transitioned from state s10 to state s1 (FIG. 6E) the clock pulse 84 was generated by circuit 14. Each clock pulse 84 and 86 was generated by circuit 14 during the second half of the time period the data stream of FIG. 6B is at the logic one state (reference numeral 87).

From the foregoing it may readily be seen that the present invention comprises a new, unique and exceedingly useful signal converter for converting a missile's telemetry data which is bi-phase-level data to non-return-to-zero-level data which constitutes a considerable improvement over the known prior art. Obviously, many modifications and variations of the present invention are possible in light of the above teachings. It is therefore to be understood within the scope of the appended claims, that the invention may be practiced otherwise than as specifically claimed.

Appendix A

```
SUBDESIGN hilevdet
(
    _aclr    :INPUT;
    _hilev   :OUTPUT;
    clock    :INPUT;
)
VARIABLE
    s : MACHINE OF BITS (_hilev,qc,qb,qa)
        WITH STATES    (s0 = b"1000",
                        s1 = b"1000",
                        s2 = b"1011",
                        s3 = b"1010",
                        s4 = b"1110",
                        s5 = b"1111",
                        s6 = b"1101",
                        s7 = b"0101"),
BEGIN
s.clk = clock;
s.reset = !_aclr;
CASE s IS
    WHEN s0 => s =s1;
    WHEN s1 => s =s2;
    WHEN s2 => s =s3;
    WHEN s3 => s =s4;
    WHEN s4 => s =s5;
    WHEN s5 => s =s6;
    WHEN s6 => s =s7;
    WHEN s7 => s =s1;
END CASE;
END;
```

Appendix B

```
SUBDESIGN g4
(
    _aclr    :INPUT;
```

Appendix B-continued

```
    tick     :OUTPUT;
    clock    :INPUT;
    in       :INPUT;
)
VARIABLE
    s : MACHINE OF BITS (qd,qc,qb,qa)
        WITH STATES (s0,s1,s2,s3,s4,s5,s6,s7,s8,s9,s10);
BEGIN
s.clk = clock;
s.reset = !_aclr;
CASE s IS
    WHEN s0 =>
        IF (in) THEN
            s = s0;
        ELSE
            s = s1;
        END IF;
    WHEN s1 =>
        IF (!in) THEN
            s = s1;
        ELSE
            s = s2;
        END IF;
    WHEN s2 =>
        IF (!in) THEN
            s = s1;
        ELSE
            s = s3;
        END IF;
    WHEN s3 => s =s4;
    WHEN s4 => s =s5;
    WHEN s5 => s =s6;
    WHEN s6 => s =s7;
    WHEN s7 => s =s8;
    WHEN s8 =>
        IF (!in) THEN
            s = s1;
        ELSE
            s = s9;
        END IF;
    WHEN s9 =>
        IF (!in) THEN
            s = s1;
        ELSE
            s = s10;
        END IF;
    WHEN s10 => s =s1;
END CASE;
tick = (s == s1);
END;
```

What is claimed is:

1. A telemetry data signal converter for converting a bi-phase-level data stream to a non-return-to-zero-level data stream and extracting a non-return-to-zero level clock signal from said bi-phase-level data stream, said telemetry data signal converter comprising:

decoding circuit means for receiving said bi-phase-level data stream and an externally generated clock signal, said externally generated clock signal cycling said decoding circuit means through states s1, s2, s3, s4, s5, s6 and s7 whenever said bi-phase-level data stream is at a first logic state, said bi-phase-level data stream resetting said decoding circuit means to a state s0 whenever said bi-phase-level data stream is at a second logic state;

said decoding circuit means generating a high level detect signal having a plurality of high level detect pulses, said decoding circuit means generating each one of said high level detect pulses whenever said decoding circuit means transitions through said state s7;

clock signal generating means coupled to said decoding circuit means to receive the high level detect pulses of said high level detect signal, said clock signal generating means receiving said externally generated clock signal, said externally generated clock signal cycling said clock signal generating means through states s1, s2, s3, s4, s5, s6, s7, s8, s9 and s10, each of the high level detect pulses of said high level detect signal resetting said clock signal generating means to said state s1;

said clock signal generating means generating a clock pulse of said non-return-to-zero level clock signal whenever said clock signal generating means transitions through said state s1;

Flip-Flop means having a clock input for receiving said non-return-to-zero level clock signal and a data input for receiving said bi-phase-level data stream, said Flip-Flop means, responsive to said non-return-to-zero level clock signal, converting said bi-phase-level data stream to said non-return-to-zero-level data stream.

2. The telemetry data signal converter of claim 1 wherein decoding circuit means comprises a state machine having said states s0, s1, s2, s3, s4, s5, s6 and s7.

3. The telemetry data signal converter of claim 1 wherein said clock signal generating means comprises a state machine having said states s1, s2, s3, s4, s5, s6, s7, s8, s9 and s10.

4. The telemetry data signal converter of claim 1 wherein said Flip-Flop means comprises a D-type Flip-Flop.

5. The telemetry data signal converter of claim 1 wherein said high level decoder circuit comprises a state machine having states s0, s1, s2, s3, s4, s5, s6 and s7.

6. The telemetry data signal converter of claim 1 wherein said clock signal generating circuit comprises a state machine having states s0, s1, s2, s3, s4, s5, s6, s7, s8, s9 and s10.

7. The telemetry data signal converter of claim 1 wherein said Flip-Flop comprises a D-type Flip-Flop.

8. A telemetry data signal converter for converting a bi-phase-level data stream to a non-return-to-zero-level data stream and extracting a non-return-to-zero level clock signal from said bi-phase-level data stream, said telemetry data signal converter comprising:

decoding circuit means for receiving said bi-phase-level data stream and an externally generated clock signal, said externally generated clock signal cycling said decoding circuit means through states s1, s2, s3, s4, s5, s6 and s7 whenever said bi-phase-level data stream is at a first logic state, said bi-phase-level data stream resetting said decoding circuit means to a state s0 whenever said bi-phase-level data stream is at a second logic state;

said decoding circuit means generating a high level detect signal having a plurality of high level detect pulses, said decoding circuit means generating each one of said high level detect pulses whenever said decoding circuit means transitions through said state s7;

clock signal generating means coupled to said decoding circuit means to receive the high level detect pulses of said high level detect signal, said clock signal generating means receiving said externally generated clock signal, said externally generated clock signal cycling said clock signal generating means through states s1, s2, s3, s4, s5, s6, s7, s8, s9 and s10, each of the high level detect pulses of said high level detect signal resetting said clock signal generating means to said state s1;

said clock signal generating means generating a clock pulse of said non-return-to-zero level clock signal whenever said clock signal generating means transitions through said state s1;

Flip-Flop means having a clock input for receiving said non-return-to-zero level clock signal and a data input for receiving said bi-phase-level data stream, said Flip-Flop means, responsive to said non-return-to-zero level clock signal, converting said bi-phase-level data stream to said non-return-to-zero-level data stream; and multiplexing means coupled to said Flip-Flop means to receive said non-return-to-zero-level data stream, said multiplexing means receiving said bi-phase-level data stream and an externally generated select signal;

said multiplexing means passing said non-return-to-zero-level data stream through said multiplexing means whenever said externally generated select signal is at a first logic state, said multiplexing means passing said bi-phase-level data stream through said multiplexing means whenever said externally generated select signal is at a second logic state.

9. The telemetry data signal converter of claim 8 wherein decoding circuit means comprises a state machine having said states s0, s1, s2, s3, s4, s5, s6 and s7.

10. The telemetry data signal converter of claim 8 wherein said clock signal generating means comprises a state machine having said states s1, s2, s3, s4, s5, s6, s7, s8, s9 and s10.

11. The telemetry data signal converter of claim 10 wherein said state machine has an asychronous clear input for receiving an externally generated reset signal, said state machine being reset to a state s0 by said externally generated reset signal.

12. The telemetry data signal converter of claim 8 wherein said Flip-Flop means comprises a D-type Flip-Flop.

13. A telemetry data signal converter comprising:

a high level decoder circuit having a clock input for receiving an externally generated clock signal, an asynchrounous clear input for receiving a bi-phase-level data stream and a high level signal output;

a clock signal generating circuit having a signal input connected to the high level signal output of said high level decoder circuit, an asynchrounous clear input for receiving an externally generated reset signal, a clock input for receiving said externally generated clock signal, and a clock signal output for providing a non-return-to-zero-level clock signal;

a Flip-Flop having a data input for receiving said bi-phase-level data stream, a clock input connected to the clock signal output of said clock signal generating circuit, a clear input for receiving said externally generated reset signal and a Q output for providing a non-return-to-zero level data stream; and a multiplexer having a first data input for receiving said bi-phase-level data stream, a second data input connected to the Q output of said Flip-Flop, a select input for receiving an externally generated select signal and an output for providing said bi-phase-level data stream or said non-return-to-zero level data stream.

* * * * *